(12) United States Patent
Switzer et al.

(10) Patent No.: US 10,965,247 B2
(45) Date of Patent: Mar. 30, 2021

(54) APPARATUS AND METHOD FOR MEASURING ONE OR MORE CHARACTERISTICS OF ONE OR MORE PHOTOVOLTAIC CELLS

(71) Applicant: NEWPORT CORPORATION, Irvine, CA (US)

(72) Inventors: Greggory W. Switzer, Irvine, CA (US); Eric H. Shelton, Irvine, CA (US)

(73) Assignee: NEWPORT CORPORATION, Irvine, CA (US)

( * ) Notice: Subject to any disclaimer, the term of this patent is extended or adjusted under 35 U.S.C. 154(b) by 484 days.

(21) Appl. No.: 15/738,844

(22) PCT Filed: Nov. 11, 2015

(86) PCT No.: PCT/US2015/060107
§ 371 (c)(1),
(2) Date: Dec. 21, 2017

(87) PCT Pub. No.: WO2016/209304
PCT Pub. Date: Dec. 29, 2016

(65) Prior Publication Data
US 2018/0191297 A1    Jul. 5, 2018

Related U.S. Application Data

(60) Provisional application No. 62/184,978, filed on Jun. 26, 2015.

(51) Int. Cl.
*H02S 50/10* (2014.01)
*G01R 31/00* (2006.01)

(52) U.S. Cl.
CPC .............. *H02S 50/10* (2014.12); *G01R 31/00* (2013.01)

(58) Field of Classification Search
CPC ......... H02S 50/10; G01R 31/00; G01R 29/12; G01R 5/28; G01R 29/24; G01R 29/0842; G01W 1/16
See application file for complete search history.

(56) References Cited

U.S. PATENT DOCUMENTS

| 4,695,785 A | 9/1987 | Mieth et al. |
| 2011/0194216 A1 | 8/2011 | Schaub et al. |

(Continued)

FOREIGN PATENT DOCUMENTS

| CN | 102171906 | 8/2011 |
| CN | 102967766 | 3/2013 |

(Continued)

OTHER PUBLICATIONS

Chinese Office Action for Chinese Application No. 201580082528.0, dated Feb. 2, 2019, 4 pages.

(Continued)

*Primary Examiner* — Jermele M Hollington
*Assistant Examiner* — Suresh K Rajaputra
(74) *Attorney, Agent, or Firm* — Loza & Loza, LLP; George L. Fountain

(57) ABSTRACT

An apparatus for facilitating a measurement of characteristics of a photovoltaic cell. The apparatus includes an input port for coupling to a photovoltaic cell and an output port for coupling to a measurement equipment. The apparatus is configured to couple a first resistor across positive and negative inputs of the input port and a second resistor between the negative input and ground when the input port is not selected or inactive, and decouple the first and second resistors from the input port when the input port is selected and active. The apparatus couples the positive input of the input port to the output port when the input port is selected but inactive or selected and active. The resistors protect the (Continued)

photovoltaic cell from adverse consequences due to incident ambient light. Examples of multiple port versions of the apparatus are also disclosed.

15 Claims, 11 Drawing Sheets

(56) References Cited

U.S. PATENT DOCUMENTS

| | | |
|---|---|---|
| 2013/0181736 A1 | 7/2013 | Gostein et al. |
| 2013/0307556 A1* | 11/2013 | Ledenev ............... G01R 31/50 324/509 |
| 2014/0253138 A1* | 9/2014 | Ishii ..................... H02S 50/10 324/509 |

FOREIGN PATENT DOCUMENTS

| | | |
|---|---|---|
| CN | 103091558 | 8/2015 |
| EP | 2680019 | 1/2014 |
| JP | 201333825 | 2/2013 |
| WO | 2012120683 | 9/2012 |
| WO | 2015015836 | 2/2015 |
| WO | 2016209304 | 12/2016 |

OTHER PUBLICATIONS

Chinese Search Report for Chinese Application No. 201580082528.0, dated Feb. 2, 2019, 2 pages.
European Search Report for European Application No. 15896585.5 dated Feb. 11, 2019, 6 pages.
International Search Report for International Appl. No. PCT/US15/60107 dated Jan. 29, 2016, 2 pages.
International Written Opinion for International Appl. No. PCT/US15/60107 dated Jan. 29, 2016, 6 pages.
Korean Office Action for Korean Application No. 10-2018-7002146, dated May 19, 2020, 10 pages.

* cited by examiner

APPARATUS AND METHOD FOR MEASURING ONE OR MORE CHARACTERISTICS OF ONE OR MORE PHOTOVOLTAIC CELLS

CROSS-REFERENCE TO A RELATED APPLICATION

This application claims the benefit of the filing date of Provisional Application, Ser. No. 62/184,978, filed on Jun. 26, 2015, entitled, "Programmable Light Bias Amplifier for use in Internal Quantum Efficiency Testing Systems," which is incorporated herein by reference.

BACKGROUND

Field

Aspects of the present disclosure relate generally to photovoltaic devices, and more particularly, to an apparatus and method for measuring one or more characteristics of one or more photovoltaic cells.

Background

Quantum efficiency measuring systems are used to assess the efficiency of photovoltaic devices in converting incident photons to an associated electrical charge. Commonly, these quantum efficiency measuring systems are used in testing and characterizing conversion efficiencies of photovoltaic cells (hereinafter "PV cells"). More specifically, Internal Quantum Efficiency (hereinafter "IQE") measures the ratio of the number of charge carriers collected by the PV cell to the number of photons of a given energy that are incident on the PV cell which are absorbed by the cell.

Presently, the IQE of a PV cell is measured using one or more solar simulators. More specifically, the PV cell under test is positioned on or proximate to a solar simulator, which is configured to emit radiation having a spectral profile within a selected wavelength range substantially similar to the spectral profile within the selected wavelength range as emitted by the sun. Thereafter, one or more measurement circuits or devices may be electrically coupled to the PV cell. The measurement circuits or devices are configured to measure the current at a selected voltage bias generated by the PV cell in response to the incident radiation. Thereafter, the IQE of the PV cell under test may be determined by comparing the ratio of known photon energy emitted by the solar simulator incident on the PV cell to the resulting current generated by the PV cell due to photovoltaic reactions.

While prior art IQE testing systems have proven to be somewhat useful in determining the IQE of PV cells, a number of shortcomings have been identified. For example, the nature and operation of PV cells make testing difficult and inherently inaccurate. More specifically, ambient light incident on the PV cell before and during the testing process may lead to a myriad of inaccuracies. For example, ambient light incident of a PV cell before testing may result in the unwanted and undesirable generation of voltage/current within the PV cell. As such, the PV cell may operate essentially as a capacitor and, thus, be subjected to an undesirable and potentially damaging over-voltage situation. Further, when the PV cell is electrically connected to the sensitive IQE testing circuit or device, the stored electrical voltage/current could be rapidly discharged (e.g. surge) into the circuit or device thereby damaging the PV cell, the internal components of the circuit or device, or both. Further, the charge generated by the ambient light incident on the PV cell may result in an increased temperature of the PV cell before and/or during the testing process. As such, the performance of the PV cell may be adversely affected by the temperature increase. Further, sufficient temperature fluctuations with the PV cell may damage the cell.

As such, there is an ongoing need for an IQE measuring system which accounts for or otherwise dissipates the voltage/current resulting from ambient light prior to initiation of the measurement process.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus for facilitating a measurement of one or more characteristics of a photovoltaic cell. The apparatus comprises a routing circuit configured to: couple a first resistor to a first input port in accordance with a first configuration, wherein the first input port is configured to be coupled to a photovoltaic cell; decouple the first resistor from the first input port in accordance with a second configuration; and couple the first input port to an output port in accordance with the second configuration, wherein the output port is configured to be coupled to a measurement equipment. The apparatus further comprises a controller configured to generate at least one control signal to selectively configure the routing circuit in the first or second configuration based on a mode select signal.

Another aspect of the disclosure relates to another apparatus for facilitating a measurement of one or more characteristics of first and second photovoltaic cells. The apparatus comprises a routing circuit configured to: couple a first resistor to first and second input ports in accordance with a first configuration, wherein the first and second input ports are configured to be coupled to the first and second photovoltaic cells, respectively; decouple the first resistor from the first input port in accordance with a second configuration; and couple the first input port to an output port in accordance with the second configuration, wherein the output port is configured to be coupled to a measurement equipment. The apparatus further comprises a controller configured to generate at least one control signal to selectively configure the routing circuit in the first or second configuration based on a mode select signal.

Another aspect of the disclosure relates to yet another apparatus for facilitating a measurement of one or more characteristics of first and second photovoltaic cells. The apparatus comprises a first input port including positive and negative inputs configured to be coupled to positive and negative terminals of a first photovoltaic cell; a second input port including positive and negative inputs configured to be coupled to positive and negative terminals of a second photovoltaic cell; an output port configured to be coupled to a measurement equipment; and a routing circuit.

The routing circuit, in turn, is placed: (1) in a first configuration where first and second resistors are coupled across the respective positive and negative inputs of the first and second input ports, a third resistor is coupled between the negative inputs of the first and second input ports and ground, and the positive input port of the first input port is coupled to the output port; (2) in a second configuration where the second resistor is coupled across the positive and negative inputs of the second input port, the first resistor is not coupled across the positive and negative inputs of the first input port, the third resistor is shorted across the negative inputs of the first and second input ports and ground, and the positive input port of the first input port is coupled to the output port.

Additionally, the routing circuit is placed: (3) in a third configuration where first and second resistors are coupled across the respective positive and negative inputs of the second and first input ports, the third resistor is coupled between the negative inputs of the first and second input ports and ground, and the positive input port of the second input port is coupled to the output port; and (4) in a fourth configuration where the second resistor is coupled across the positive and negative inputs of the first input port, the first resistor is not coupled across the positive and negative inputs of the second input port, the third resistor is shorted across the negative inputs of the first and second input ports and ground, and the positive input port of the second input port is coupled to the output port.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
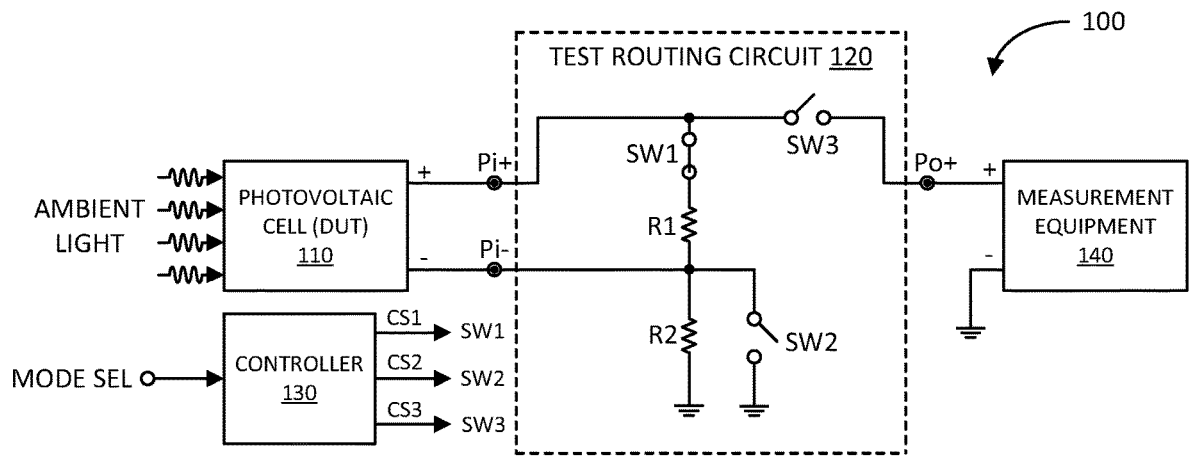
FIG. 1A illustrates a schematic diagram of an exemplary single-channel measurement apparatus in a first configuration in accordance with an aspect of the disclosure.

FIG. 1A illustrates a schematic diagram of an exemplary single-channel measurement apparatus 100 in an unselected channel configuration in accordance with an aspect of the disclosure. The measurement apparatus 100 includes a test routing circuit 120 and a controller 130 for configuring the test routing circuit 120 based on a mode select signal ("MODE SEL"). A photovoltaic (PV) cell 110 (e.g., a device-under-test (DUT)) is coupled to positive and negative input ports Pi+ and Pi− of the test routing circuit 120. A measurement equipment 140 includes a positive terminal coupled to the positive output port Po+ of the test routing circuit 120. The measurement equipment 140 includes a negative terminal coupled to ground, which may also be the ground used by the test routing circuit 120.

As discussed, the measurement apparatus 120 is in the unselected channel configuration, whereby the test routing circuit 120 is configured to couple a resistor R1 across the positive and negative terminals of the PV cell 110 by way of the input ports Pi+ and Pi−, respectively. Additionally, in this configuration, the testing routing circuit 120 is also configured to couple a resistor R2 between the negative terminal of the PV cell 110 via the negative input port Pi− and ground. Further, in this configuration, the PV cell 110 is not coupled to the measurement equipment 140.

The controller 130 is configured to place the test routing circuit 120 in the unselected channel configuration by generating appropriate control signals CS1, CS2, and CS3 that control the open/close states of switches SW1, SW2, and SW3 of the test routing circuit 120, respectively. That is, in response to a MODE SEL signal requesting the unselected channel configuration, the controller 130 generates control signals CS1, CS2, and CS3 to close switch SW1 and open switches SW2 and SW3, respectively. Thus, as illustrated, the test routing circuit 120 couples resistor R1 across the positive and negative terminals of the PV cell 110, couples resistor R2 between the negative terminal of the PV cell and ground, and decouples the positive terminal of the PV cell from the measurement equipment 140.

In the unselected channel configuration, the test routing circuit 120 protects the PV cell 110 from adverse consequences as a result of ambient light incident upon the PV cell. Thus, if the PV cell 110 generates charge due to incident ambient light, the charge will discharge via the resistors R1 and R2 to ground. This helps prevent an over-voltage condition, current surge, and temperature increase and fluctuations if the PV cell were not otherwise protected, as discussed in the Background section.

Figure 1B:
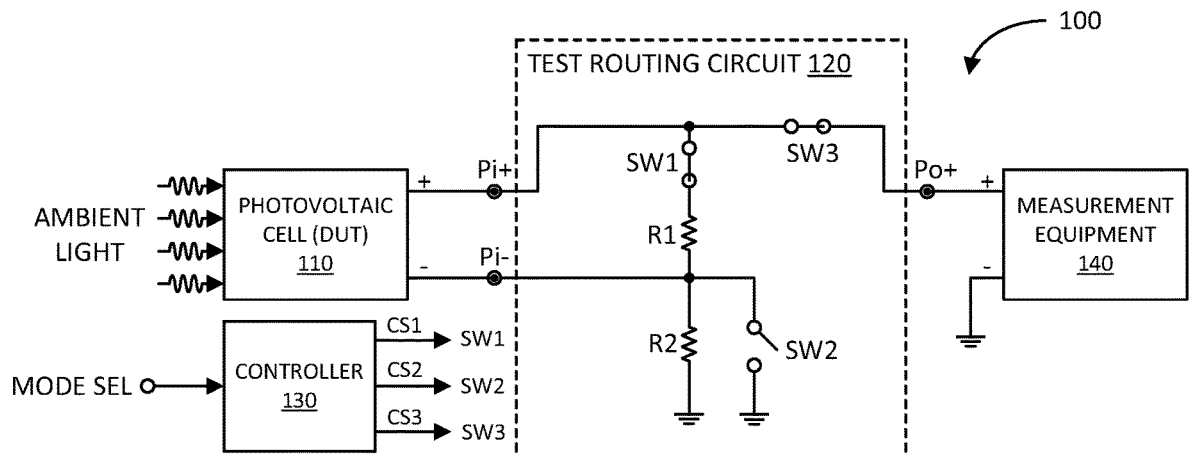
FIG. 1B illustrates a schematic diagram of the exemplary single-channel measurement apparatus of FIG. 1A in a second configuration in accordance with another aspect of the disclosure.

FIG. 1B illustrates a schematic diagram of the exemplary single-channel measurement apparatus 100 in an inactive selected channel configuration in accordance with another aspect of the disclosure. In this configuration, the test routing circuit 120 is configured to couple the positive terminal of the PV cell 110 to the measurement equipment 140. Additionally, in this configuration, the resistor R1 remains across the positive and negative terminals of the PV cell 110, and the resistor R2 remains coupled between the negative terminal of the PV cell and ground.

That is, in response to a MODE SEL signal requesting the inactive selected channel configuration, the controller 130 generates control signals CS1, CS3 and CS2 to close switches SW1 and SW3 and open switch SW2, respectively. Thus, as illustrated, the test routing circuit 120 couples resistor R1 across the positive and negative terminals of the PV cell 110, couples resistor R2 between the negative terminal of the PV cell and ground, and couples the positive terminal of the PV cell to the measurement equipment 140 via the positive input port Pi+ and positive output port Po+.

In the inactive selected channel configuration, the PV cell 110 remains protected from adverse consequences from incident ambient light as discussed, but is also coupled to the measurement equipment 140. In this configuration, the coupling of the PV cell 110 to the measurement equipment 140 may prevent current surge between PV cell and the measurement equipment when the test routing circuit 120 is subsequently configured in activate selected channel configuration. The inactive selected channel configuration may be an intermediate configuration when going between the unselected channel configuration and the activate selected channel configuration.

Figure 1C:
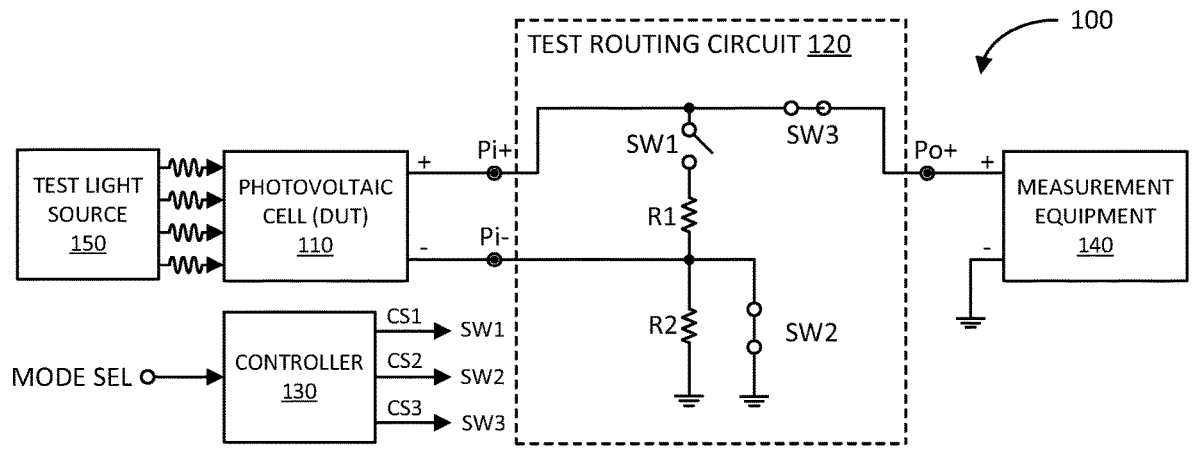
FIG. 1C illustrates a schematic diagram of the exemplary single-channel measurement apparatus of FIG. 1A in a third configuration in accordance with another aspect of the disclosure.

FIG. 1C illustrates a schematic diagram of the exemplary single-channel measurement apparatus 100 in the activate selected channel configuration in accordance with another aspect of the disclosure. In this configuration, the test routing circuit 120 is configured to couple the positive terminal of the PV cell to the measurement equipment 140. Additionally, in this configuration, the test routing circuit 120 removes resistor R1 from being coupled across the positive and negative terminals of the PV cell 110, and removes the resistor R2 from being coupled between the negative terminal of the PV cell and ground (e.g., by shorting out the resistor R2).

That is, in response to a MODE SEL signal requesting the activate selected channel configuration, the controller 130 generates control signals CS1, CS2 and CS3 to open switch SW1 and close switches SW2 and SW3, respectively. Thus, as illustrated, the test routing circuit 120 removes resistor R1 from being coupled across the positive and negative terminals of the PV cell 110, and shorts out resistor R2 so that the negative terminal of the PV cell is coupled directly to ground. Additionally, the test routing circuit 120 couples the positive terminal of the PV cell 110 to the measurement equipment 140 via the positive input port Pi+ and positive output port Po+.

In the activate selected channel configuration, the measurement apparatus 100 is configured to perform a measurement of one or more characteristics of the PV cell 110. Such one or more characteristics may include an Internal Quantum Efficiency (IQE), an External Quantum Efficiency (EQE), and/or other one or more characteristics. As illustrated, a test light source 150 is positioned to generate a defined light incident upon the PV cell 110. The defined light may have one or more defined properties (e.g., wavelength, wavelength range, certain polarization, etc.) in accordance with the desired measurement. In response to the incident light, the PV cell 110 generates a current and a voltage across its positive and negative terminals. The measurement equipment 140 may perform one or more measurements based on the generated current and/or voltage by the PV cell 110. As an example, the measurement equipment 140 may be configured as a detector including a transimpedance amplifier (TIA) configured to generate a voltage based on the current generated by the PV cell 110.

After completion of the measurement, the test routing circuit 120 may be configured again in the inactive selected channel configuration via a corresponding MODE SEL signal sent to the controller 130. Following the inactive selected channel configuration, the test routing circuit 120 may be configured again in the unselected channel configuration via a corresponding MODE SEL signal sent to the controller 130. Again, the intermediate inactive selected channel configuration may prevent damage to the PV cell 110 by providing a smoother transition between the unselected channel configuration and the activate selected channel configuration.

Figure 2A:
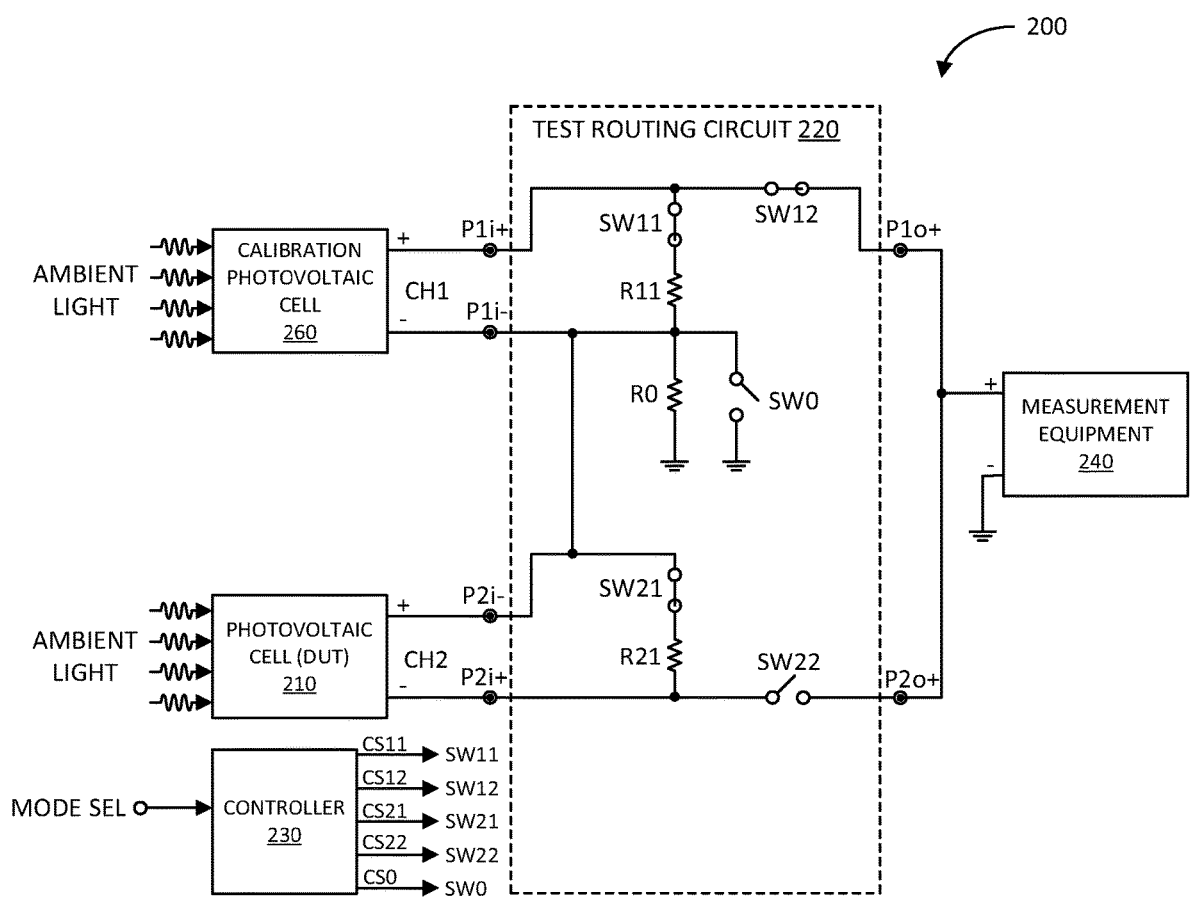
FIG. 2A illustrates a schematic diagram of an exemplary dual-channel measurement apparatus in a first configuration in accordance with another aspect of the disclosure.

FIG. 2A illustrates a schematic diagram of an exemplary dual-channel measurement apparatus 200 in accordance with another aspect of the disclosure. The dual-channel measurement apparatus 200 is similar to that of the single-channel measurement apparatus 100, but includes an additional channel Because of the additional channel, the dual-measurement apparatus 200 may include at least four (4) mode configurations. In summary, the mode configuration are: (1) inactive selected channel 1 configuration; (2) active selected channel 1 configuration; (3) inactive selected channel 2 configuration; and (4) active selected channel 2 configuration.

In particular, the dual-channel measurement apparatus 200 includes a test routing circuit 220 and a controller 230 for configuring the test routing circuit 220 based on a MODE SEL signal. A PV cell 260 (e.g., a PV cell used for calibrating the measurement) is coupled to positive and negative input ports P1i+ and P1i− associated with channel 1 (CH1) of the test routing circuit 220. Similarly, a PV cell 210 (e.g., a device-under-test (DUT)) is coupled to positive and negative input ports P2i+ and P2i− associated with channel 2 (CH2) of the test routing circuit 220. A measurement equipment 240 includes a positive terminal coupled to the positive output port Po+ of the test routing circuit 220. The measurement equipment 240 includes a negative terminal coupled to ground, which may also be the ground used by the test routing circuit 220.

In FIG. 2A, the measurement apparatus 100 is in an inactive selected channel 1 configuration, whereby the test routing circuit 220 is configured to: (1) couple a resistor R11 across the positive and negative terminals of the PV cell 260 by way of the channel 1 input ports P1i+ and P1i−, respectively; (2) couple the positive terminal of the PV cell 260 to the measurement equipment 240 by way of channel 1 positive input and output ports P1i+ and P1o+; (3) couple a resistor R21 across the positive and negative terminals of the PV cell 210 by way of the channel 2 input ports P2i+ and P2i−, respectively; (4) couple a resistor R0 between the negative terminals of PV cells 260 and 210 and ground via the channel 1 and 2 negative input ports P1i− and P2i−, respectively; and (5) decouple the positive terminal of PV cell 210 from the measurement equipment 240. This configuration may be appropriate prior to performing a measurement of one or more characteristics of PV cell 260.

The controller 230 is configured to place the test routing circuit 220 in the inactive selected channel 1 configuration by generating appropriate control signals CS11, CS12, CS21, CS22, and CS0 that control the open/close states of switches SW11, SW12, SW21, SW22, and SW0 of the test routing circuit 220, respectively. That is, in response to a MODE SEL signal requesting the inactive selected channel 1 configuration, the controller 230 generates control signals CS11, CS12, CS21, CS22, and CS0 to close switches SW11, SW12, and SW21, and open switches SW22 and SW0, respectively. Thus, these switch states configure the test routing circuit 220 to implement the inactive selected channel 1 configuration.

In the inactive selected channel 1 configuration, the test routing circuit 220 protects the PV cells 260 and 210 from adverse consequences as a result of ambient light incident upon the PV cells. Thus, if the PV cells 260 and 210 generate charge due to incident ambient light, the charge will discharge via the respective resistors R11 and R21 and commonly via resistor R0 to ground. This helps prevent overvoltage conditions, current surges, and temperature increases and fluctuations if the PV cells were not otherwise protected, as previously discussed.

Figure 2B:
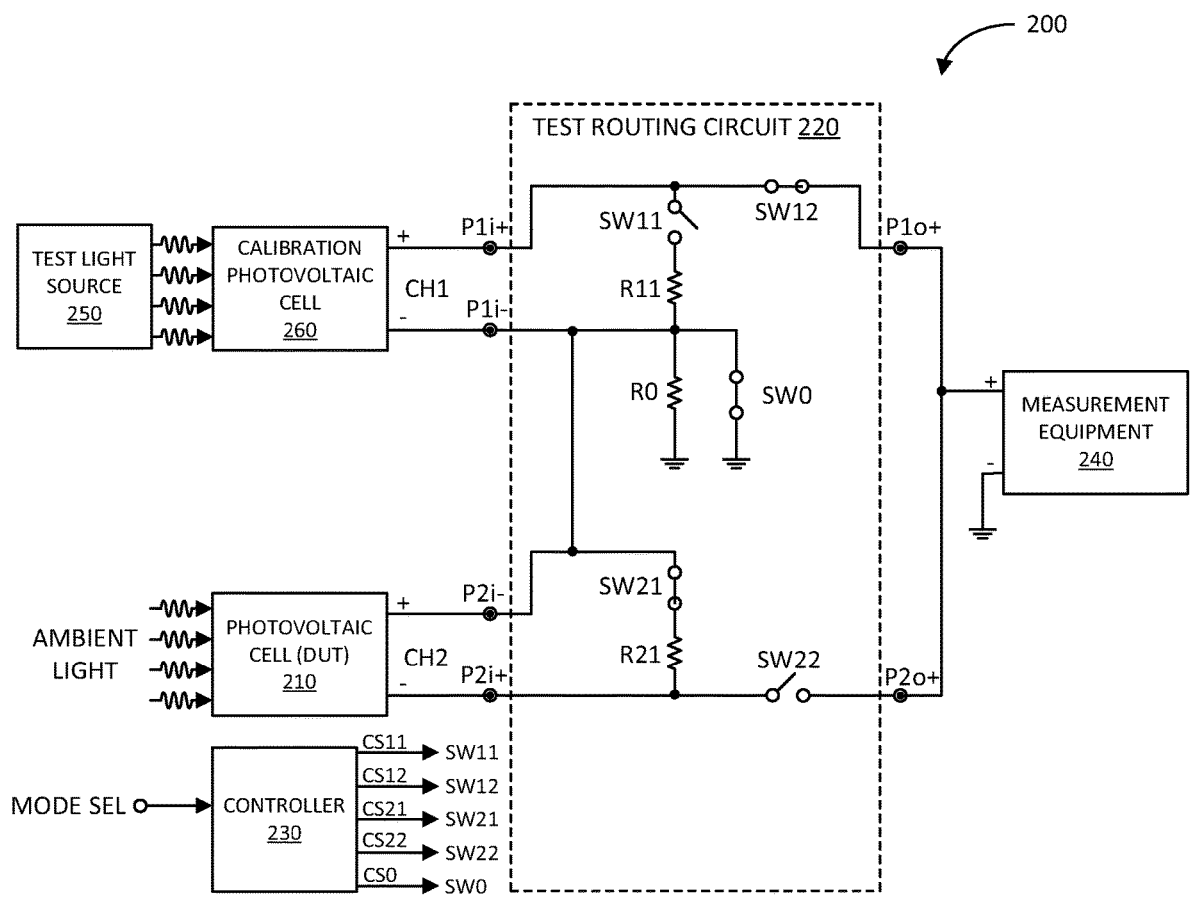
FIG. 2B illustrates a schematic diagram of the exemplary dual-channel measurement apparatus of FIG. 2A in a second configuration in accordance with another aspect of the disclosure.

FIG. 2B illustrates a schematic diagram of the exemplary dual-channel measurement apparatus 200 in an active selected channel 1 configuration in accordance with another aspect of the disclosure. In this configuration, the test routing circuit 220 is configured to facilitate a measurement of one or more characteristics of the PV cell 260.

That is, in the active selected channel 1 configuration, the test routing circuit 220 is configured to: (1) decouple the resistor R11 from being connected across the positive and negative terminals of the PV cell 260; (2) couple the positive terminal of the PV cell 260 to the measurement equipment 240; (3) couple the resistor R21 across the positive and negative terminals of the PV cell 210; (4) short out resistor R0; and (5) decouple the positive terminal of PV cell 210 from the measurement equipment 240.

The controller 230 is configured to place the test routing circuit 220 in the active selected channel 1 configuration by generating appropriate control signals CS11, CS12, CS21, CS22, and CS0 that control the open/close states of switches SW11, SW12, SW21, SW22, and SW0 of the test routing circuit 220, respectively. That is, in response to a MODE SEL signal requesting the active selected channel 1 configuration, the controller 230 generates control signals CS11, CS22, CS12, CS21, and CS0 to open switches SW11 and SW22, and close switches SW12, SW21, and SW0, respectively. Thus, these switch states configure the test routing circuit 220 to implement the active selected channel 1 configuration.

In the active selected channel 1 configuration, the test routing circuit 220 removes the protection resistors R11 and R0 from being coupled to PV cell 260 and fully couples the PV cell 260 to the measurement equipment 240. This configures the measurement apparatus 200 for performing measurements of one or more characteristics of the PV cell 260. As illustrated, a test light source 250 is positioned to generate a defined light incident upon the PV cell 260. The defined light may have one or more defined properties (e.g., wavelength, wavelength range, certain polarization, etc.) in accordance with the desired measurement. In response to the incident light, the PV cell 260 generates a current and a voltage across its positive and negative terminals. Similar to measurement equipment 140, the measurement equipment 240 may perform one or more measurements based on the generated current and/or voltage by the PV cell 260.

With regard to the unselected channel 2, the test routing circuit 210 maintains protection resistor R21 across the positive and negative terminals of PV cell 210 to protect it from adverse consequences as a result of ambient light incident upon the PV cell 210. Thus, if PV cell 210 generates charge due to incident ambient light, the charge will discharge to ground via resistor R21. This helps prevent overvoltage condition, current surge, and temperature increases and fluctuations if the PV cell 210 were not otherwise protected, as previously discussed.

Figure 2C:
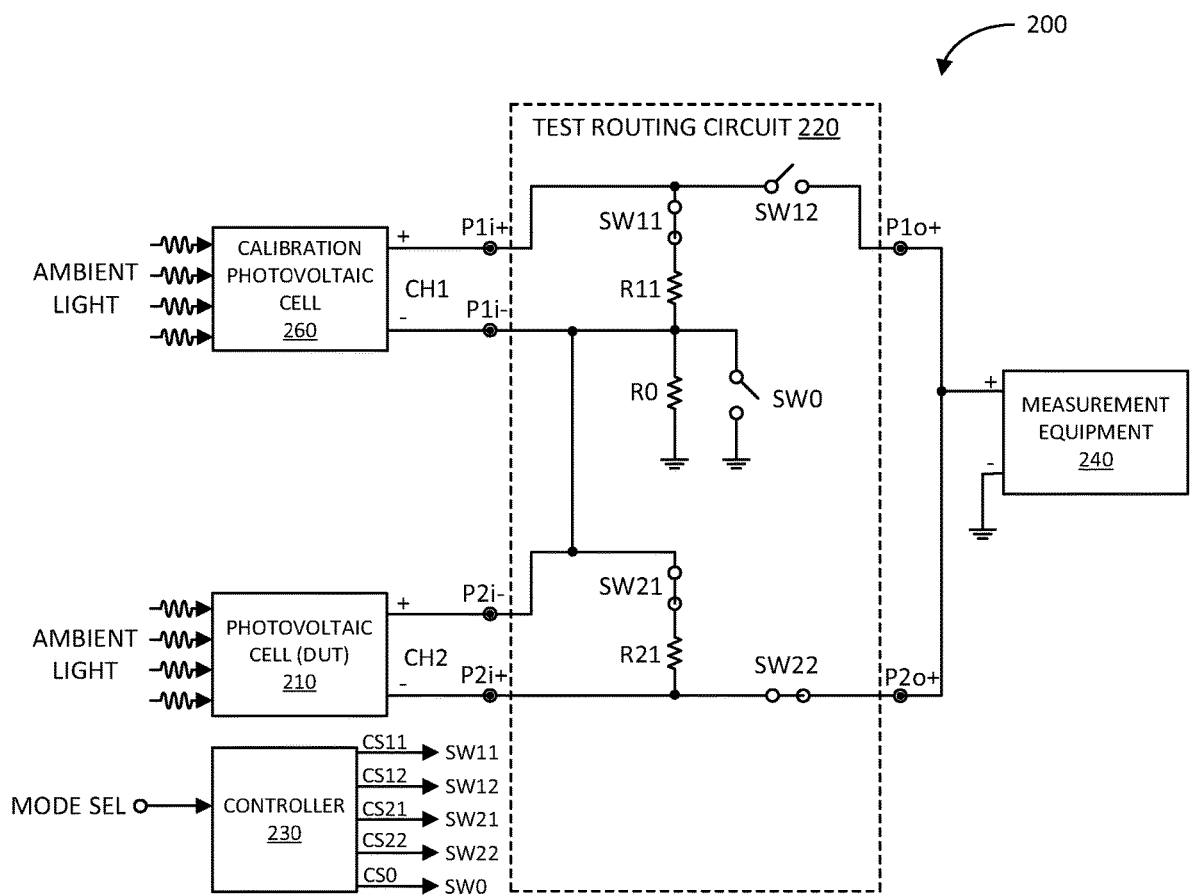
FIG. 2C illustrates a schematic diagram of the exemplary dual-channel measurement apparatus of FIG. 2A in a third configuration in accordance with another aspect of the disclosure.

FIG. 2C illustrates a schematic diagram of the exemplary dual-channel measurement apparatus 200 in an inactive selected channel 2 configuration in accordance with another aspect of the disclosure. In this configuration, the test routing circuit 220 couples PV cell 210 to the measurement equipment 240, decouples PV cell 260 from the measurement equipment, and maintains the respective protection resistors R11 and R21, and commonly resistor R0 coupled to both PV cells 260 and 210. This configuration may be appropriate prior to performing a measurement of one or more characteristics of PV cell 210.

More specifically, the measurement apparatus 200 is in the inactive selected channel 2 configuration, whereby the test routing circuit 220 is configured to: (1) couple a resistor R11 across the positive and negative terminals of the PV cell 260; (2) decouple the positive terminal of the PV cell 260 from the measurement equipment 240; (3) couple a resistor R21 across the positive and negative terminals of the PV cell 210; (4) couple a resistor R0 between the negative terminals of PV cells 260 and 210 and ground; and (5) couple the positive terminal of PV cell 210 to the measurement equipment 240.

The controller 230 is configured to place the test routing circuit 220 in the inactive selected channel 2 configuration by generating appropriate control signals CS11, CS12, CS21, CS22, and CS0 that control the open/close states of switches SW11, SW12, SW21, SW22, and SW0 of the test routing circuit 220, respectively. That is, in response to a MODE SEL signal requesting the inactive selected channel 2 configuration, the controller 230 generates control signals CS11, CS21, CS22, CS12, and CS0 to close switches SW11, SW21, and SW22, and open switches SW12 and SW0, respectively. Thus, these switch states configure the test routing circuit 220 to implement the inactive selected channel 2 configuration.

In the inactive selected channel 2 configuration, the test routing circuit 220 protects the PV cells 260 and 210 from adverse consequences as a result of ambient light incident upon the PV cells. Thus, if the PV cells 260 and 210 generate charge due to incident ambient light, the charge will discharge via the respective resistors R11 and R21 and commonly via resistor R0 to ground. This helps prevent overvoltage conditions, current surges, and temperature increases and fluctuations if the PV cells were not otherwise protected, as previously discussed.

Figure 2D:
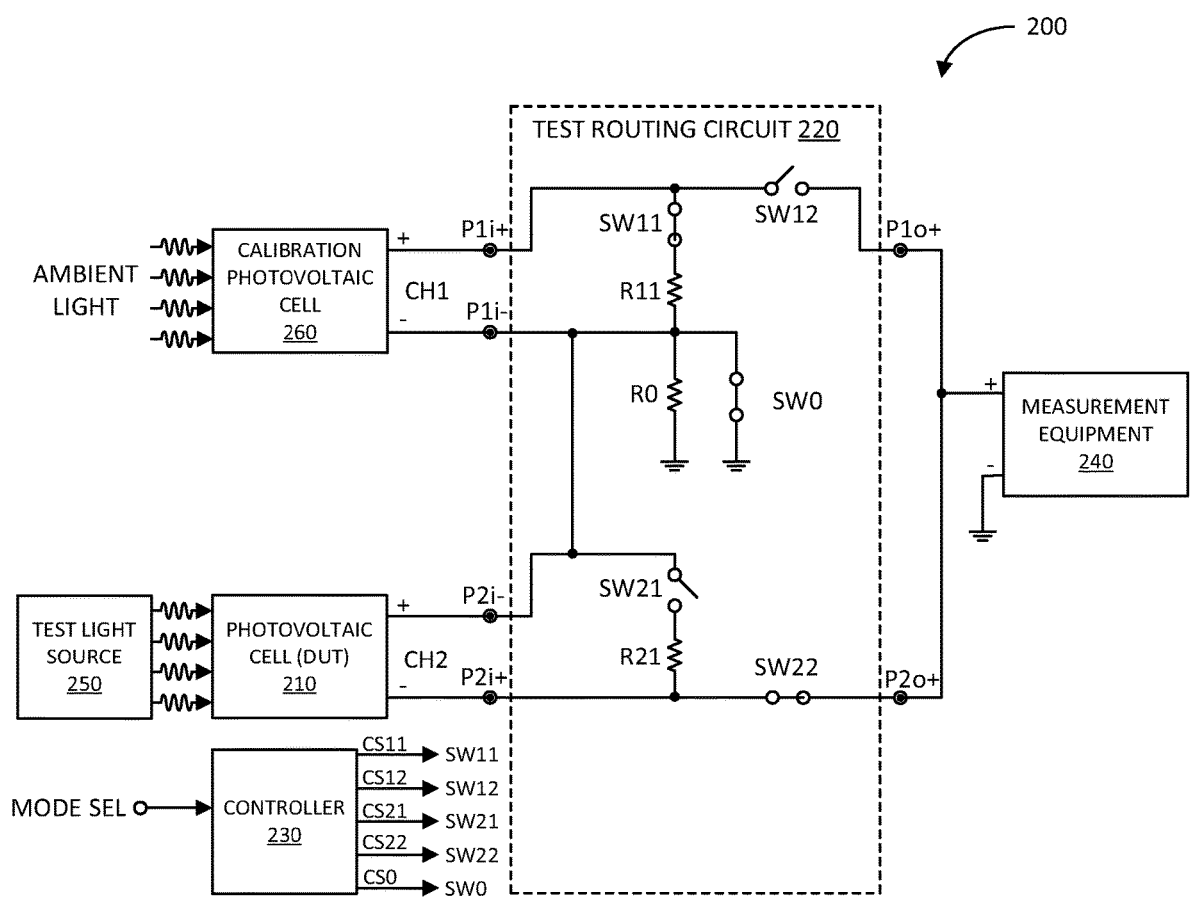
FIG. 2D illustrates a schematic diagram of the exemplary dual-channel measurement apparatus of FIG. 2A in a fourth configuration in accordance with another aspect of the disclosure.

FIG. 2D illustrates a schematic diagram of the exemplary dual-channel measurement apparatus 200 in an active selected channel 2 configuration in accordance with another aspect of the disclosure. In this configuration, the test routing circuit 220 is configured to facilitate a measurement of one or more characteristics of the PV cell 210.

That is, in the active selected channel 2 configuration, the test routing circuit 220 is configured to: (1) couple the resistor R11 across the positive and negative terminals of the PV cell 260; (2) decouple the positive terminal of the PV cell 260 from the measurement equipment 240; (3) decouple the resistor R21 from being connected across the positive and negative terminals of the PV cell 210; (4) short out resistor R0; and (5) couple the positive terminal of PV cell 210 to the measurement equipment 240.

The controller 230 is configured to place the test routing circuit 220 in the active selected channel 2 configuration by generating appropriate control signals CS11, CS12, CS21, CS22, and CS0 that control the open/close states of switches SW11, SW12, SW21, SW22, and SW0 of the test routing circuit 220, respectively. That is, in response to a MODE SEL signal requesting the active selected channel 2 configuration, the controller 230 generates control signals CS12, CS21, CS11, CS22, and CS0 to open switches SW12 and SW21, and close switches SW11, SW22, and SW0, respectively. Thus, these switch states configure the test routing circuit 220 to implement the active selected channel 2 configuration.

In the active selected channel 2 configuration, the test routing circuit 220 removes the protection resistors R21 and R0 from being coupled to PV cell 210 and fully couples the PV cell 210 to the measurement equipment 240. This configures the measurement apparatus 200 for performing measurements of one or more characteristics of the PV cell 210. As previously discussed, the test light source 250 is positioned to generate a defined light incident upon the PV cell 210. In response to the defined light, the PV cell 210 generates a current and a voltage. The measurement equipment 240 may perform one or more measurements (e.g., IQE, EQE, etc.) based on the current and/or voltage generated by the PV cell 210.

With regard to the unselected channel 1, the test routing circuit 220 maintains protection resistor R11 across the positive and negative terminals of PV cell 260 to protect it from adverse consequences as a result of ambient light incident upon the PV cell 260. Thus, if PV cell 260 generates charge due to incident ambient light, the charge will discharge to ground via resistor R11. This helps prevent overvoltage condition, current surge, and temperature increases and fluctuations if the PV cell 260 were not otherwise protected, as previously discussed.

Figure 3A:
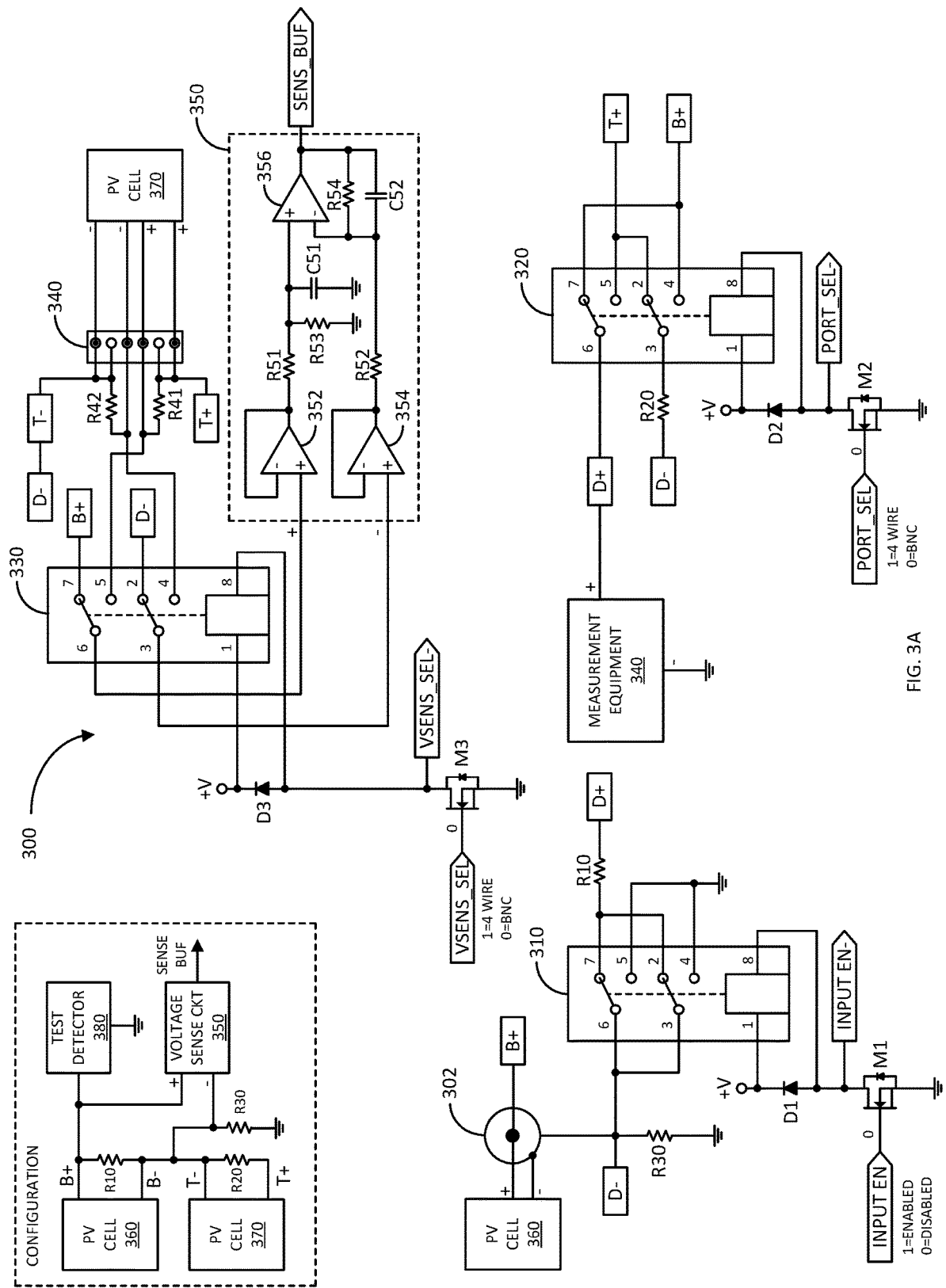
FIG. 3A illustrates a schematic diagram of an exemplary dual-channel measurement apparatus in a first configuration in accordance with another aspect of the disclosure.

FIG. 3A illustrates a schematic diagram of an exemplary dual-channel measurement apparatus 300 in accordance with another aspect of the disclosure. The dual-channel measurement apparatus 300 may be a more detailed implementation of dual-channel measurement apparatus 200 previously discussed, with at least one added feature (e.g., a voltage sense circuit). Similar to measurement apparatus 200, measurement apparatus 300 may be configured in the following configurations: (1) inactive selected BNC channel configuration; (2) active selected BNC channel configuration; (3) inactive selected 4-Wire channel configuration; and (4) active selected 4-Wire channel configuration.

In particular, the measurement apparatus 300 includes a Bayonet Neill-Concelman (hereinafter "BNC") connector 302 for connection to a PV cell 360. Although the BNC serves as one example, it shall be understood that other types of connectors may be used in place of the BNC connector. Further, in accordance with this example, the PV cell 360 may be used for calibrating measurements of one or more characteristics of a DUT cell.

Similarly, the measurement apparatus 300 includes a 4-Wire connector for connection to a PV cell 370. Although the 4-Wire serves as one example, it shall be understood that other types of connectors may be used in place of the 4-Wire connector. Further, in accordance with this example, the PV cell 370 may be a device-under-test (DUT). As illustrated, the 4-Wire connector 340 includes a first pair of ports coupled to a first set of positive and negative terminals (e.g., the middle terminals) of the PV cell 370, respectively. The middle positive and negative terminals may be a more direct connection to the PV cell 370 (e.g., without connecting by way of extensive cabling). The 4-Wire connector 340 also includes a second pair of ports coupled to a second set of positive and negative terminals (e.g., the outer terminals) of the PV cell 370, respectively. The outer positive and negative terminals may be a less direct connection to the PV cell 370 (e.g., by way of extensive cabling).

The measurement apparatus 300 comprises a relay 310. The relay 310 may have a similar functionality as the switch SW0 of the measurement apparatus 200. In particular, the relay 310 includes a first single-throw-double-pole (STDP) switch with throw terminal 3 and pole terminals 2 and 4. Additionally, the relay 310 also includes a second STDP switch with throw terminal 6 and pole terminals 7 and 5. The relay 310 includes an actuator for controlling the states of the first and second switches based on voltage levels at terminals 1 and 8.

Associated with relay 310, the measurement apparatus 300 includes circuitry for selectively setting the voltage levels at terminals 1 and 8 of the relay 310 for controlling the states of the first and second STDP switches. Such circuitry includes a diode D1 and a field effect transistor (FET) M1 coupled in series between a supply voltage rail V+ and ground. The cathode of the diode D1 is coupled to the supply voltage rail V+ and terminal 1 of the relay 310. The anode of the diode D1 is coupled to the drain of FET M1 and terminal 8 of the relay 310. The source of FET M1 is coupled to ground. And, the gate of FET M1 is configured to receive an input enable ("INPUT EN") signal. A complementary input enable ("INPUT EN–") signal may be produced at the drain of FET M1 for monitoring purposes.

The relay 310 operates as follows: In response to the INPUT EN signal being asserted (e.g., at a high logic voltage (e.g., +5V)), the FET M1 turns on causing the voltage at the drain of FET M1 (i.e., the complementary INPUT EN– signal) to be at a low logic voltage (e.g., ground). In response to the high logic voltage at terminal 1 and the low logic voltage at terminal 8, the actuator configures the first and second STDP switches of relay 310 such that terminals 3 and 4 are coupled together and terminals 6 and 5 are coupled together.

In response to the INPUT EN signal being deasserted (e.g., at a low logic voltage (e.g., ground)), the FET M1 turns off causing the voltage at the drain of FET M1 (i.e., the complementary INPUT EN– signal) to be at a high logic voltage (e.g., ~V+ or +5V). In response to high logic voltages at terminals 1 and 8, the actuator configures the first and second STDP switches of relay 310 such that terminals 3 and 2 are coupled together and terminals 6 and 7 are coupled together.

Terminals 3 and 6 of the relay 310 are coupled together and to the negative port of the BNC connector 302 at a node D–. A resistor R30 is coupled between node D– and ground.

Resistor R30 may serve a similar functionality as resistor R0 of measurement apparatus 200. Terminals 2 and 7 of the relay 310 are coupled together. A resistor R10 is coupled between terminals 2 and 7 of the relay 310 and a node D+. Resistor R10 may serve a similar functionality as resistor R11 (in some configurations) or resistor R21 (in other configurations) of measurement apparatus 200. Terminals 4 and 5 of the relay 310 are both coupled to ground.

The measurement apparatus 300 also comprises a relay 320. The relay 320 may have a similar functionality as SW11, SW12, SW21, and SW22 of the measurement apparatus 200. In particular, the relay 320 includes a first STDP switch with throw terminal 3 and pole terminals 2 and 4. Additionally, the relay 320 also includes a second STDP switch with throw terminal 6 and pole terminals 7 and 5. The relay 320 includes an actuator for controlling the states of the first and second STDP switches based on voltage levels at terminals 1 and 8.

Associated with relay 320, the measurement apparatus 300 includes circuitry for selectively setting the voltage levels at terminals 1 and 8 of the relay 320 for controlling the states of the first and second STDP switches. Such circuitry includes a diode D2 and FET M2 coupled in series between the supply voltage rail V+ and ground. The cathode of the diode D2 is coupled to the supply voltage rail V+ and terminal 1 of the relay 320. The anode of the diode D2 is coupled to the drain of FET M2 and terminal 8 of the relay 320. The source of FET M2 is coupled to ground. And, the gate of FET M2 is configured to receive a port selection ("PORT_SEL") signal. A complementary port selection ("PORT_SEL–") signal may be produced at the drain of FET M2 for monitoring purposes.

The relay 320 operates as follows: In response to the PORT_SEL signal being asserted (e.g., at a high logic voltage (e.g., +5V)), the FET M2 turns on causing the voltage at the drain of FET M2 (i.e., the complementary PORT_SEL– signal) to be at a low logic voltage (e.g., ground). In response to the high logic voltage at terminal 1 and the low logic voltage at terminal 8, the actuator configures the first and second STDP switches of relay 320 such that terminals 3 and 4 are coupled together and terminals 6 and 5 are coupled together.

In response to the PORT_SEL signal being deasserted (e.g., at a low logic voltage (e.g., ground)), the FET M2 turns off causing the voltage at the drain of FET M2 (i.e., the complementary PORT_SEL– signal) to be at a high logic voltage (e.g., ~V+ or +5V). In response to high logic voltages at terminals 1 and 8, the actuator configures the first and second STDP switches of relay 320 such that terminals 3 and 2 are coupled together and terminals 6 and 7 are coupled together.

Terminal 6 of relay 320 is coupled to a positive terminal of a measurement equipment 380 via node D+. Terminal 3 of relay 320 is coupled to node D– via resistor R20. Resistor R20 may serve a similar functionality as resistor R21 (in some configurations) or resistor R11 (in other configurations) of measurement apparatus 200. Out-of-phase terminals 4 and 7 of relay 320 are both coupled to a node B+, which is coupled to the positive port of BNC 302. Terminals 4 and 7 are out-of-phase because their corresponding throws are not coupled to these terminals at the same time. Similarly, out-of-phase terminals 2 and 5 of relay 320 are both coupled to node T+. Again, terminals 2 and 5 are out-of-phase because their corresponding throws are not coupled to these terminals at the same time.

The measurement apparatus 300 also comprises a relay 330. The relay 330 provides an additional feature beyond those provided by measurement apparatus 200. In particular, the relay 330 is configured to selectively couple the PV cell 360 or PV cell 370 to a voltage sense circuit 350. The voltage sense circuit 350 is configured to generate a sense voltage related to the voltage produced by the selected one of PV cell 360 or PV cell 370.

In particular, the relay 330 includes a first STDP switch with throw terminal 3 and pole terminals 2 and 4. Additionally, the relay 330 includes a second STDP switch with throw terminal 6 and pole terminals 7 and 5. The relay 330 includes an actuator for controlling the states of the first and second STDP switches based on voltage levels at terminals 1 and 8.

Associated with relay 330, the measurement apparatus 300 includes circuitry for selectively setting the voltage levels at terminals 1 and 8 of the relay 330 for controlling the states of the first and second STDP switches. Such circuitry includes a diode D3 and FET M3 coupled in series between the supply voltage rail V+ and ground. The cathode of the diode D3 is coupled to the supply voltage rail V+ and terminal 1 of the relay 330. The anode of the diode D3 is coupled to the drain of FET M3 and terminal 8 of the relay 330. The source of FET M3 is coupled to ground. And, the gate of FET M3 is configured to receive a sense voltage selection ("VSENS_SEL") signal. A complementary sense voltage selection signal ("VSENS_SEL–") may be produced at the drain of FET M3 for monitoring purposes.

The relay 330 operates as follows: In response to the VSENS_SEL signal being asserted (e.g., at a high logic voltage (e.g., +5V)), the FET M3 turns on causing the voltage at the drain of FET M3 (i.e., the complementary VSENS_SEL– signal) to be at a low logic voltage (e.g., ground). In response to the high logic voltage at terminal 1 and the low logic voltage at terminal 8, the actuator configures the first and second STDP switches of relay 330 such that terminals 3 and 4 are coupled together and terminals 6 and 5 are coupled together.

In response to the VSENS_SEL signal being deasserted (e.g., at a low logic voltage (e.g., ground)), the FET M3 turns off causing the voltage at the drain of FET M3 (i.e., the complementary VSENS_SEL– signal) to be at a high logic voltage (e.g., ~V+ or +5V). In response to high logic voltages at terminals 1 and 8, the actuator configures the first and second STDP switches of relay 330 such that terminals 3 and 2 are coupled together and terminals 6 and 7 are coupled together.

Terminals 6 and 3 of relay 330 are coupled to positive and negative inputs of the voltage sense circuit 350, respectively. Terminal 7 of the relay 330 is coupled to node B+, which is coupled to the positive input of the BNC connector 302. Terminal 2 is coupled to node D–, which is coupled to the negative input of the BNC connector 302. Terminal 5 of the relay 330 is coupled to the positive terminal of the middle sets of terminals of the PV cell 370, and to the positive terminal (at node T+) of the outer sets of terminals of the PV cell 370 by way of resistor R41. Similarly, terminal 4 of the relay 330 is coupled to the negative terminal of the middle sets of terminals of the PV cell 370, and to the negative terminal (at node T– and D–) of the outer sets of terminals of the PV cell 370 by way of resistor R42.

The voltage sense circuit 350 includes a first buffer amplifier 352 including a positive input coupled to terminal 6 of the relay 330, and a negative input coupled to its output. Similarly, the voltage sense circuit 350 includes a second buffer amplifier 354 including a positive input coupled to terminal 3 of the relay 330, and a negative input coupled to its output. The voltage sense circuit 350 includes a differential integrating amplifier 356 comprising: resistor R51 coupled between the output of the buffer 352 and a positive input of the amplifier 356; a resistor R52 coupled between the output of buffer 354 and a negative input of amplifier 356; resistor R53 and capacitor C51 coupled in parallel between the positive input of the amplifier 356 and ground; and resistor R54 and capacitor C52 coupled in parallel between the negative input and output of amplifier 356.

The operations of the voltage sense circuit 350 is as follows: the voltage produced at the positive and negative terminals of the selected one of the PV cell 360 or PV cell 370 is applied to the positive inputs of buffer amplifiers 352 and 354, respectively. The buffer amplifiers 352 and 354 substantially reproduces the voltage generated by the selected PV cell across their outputs. The differential integrating amplifier 356 amplifies and low-pass filters the differential voltage at the outputs of the buffers 352 and 354 to generate a sense voltage ("SENS_BUF") at the output of the amplifier 356 for measurement and/or monitoring purposes.

As depicted in FIG. 3A, the measurement apparatus 300 is in an inactive selected BNC channel configuration. A summary of this configuration is depicted on an upper left portion of FIG. 3A. That is, in the inactive selected BNC configuration, the positive terminal of the PV cell 360 is coupled to positive inputs of the measurement equipment 380 and the voltage sense circuit 350. The negative terminals of the PV cells 360 and 370 are coupled to the negative input of the voltage sense circuit 350. The resistor R30 is coupled between the negative terminals of the PV cells 360 and 370 and ground. And, the resistor R20 is coupled across the positive and negative terminals of the PV cell 370. In this configuration, the resistors R10, R20, and R30 protect the PV cells 360 and 370 from adverse consequence due to ambient light incident upon the cells. Also, in this configuration, the positive terminal of the PV cell 360 is coupled to the measurement equipment 380.

To effectuate the inactive selected BNC configuration, the INPUT EN, PORT_SEL, and VSENS_SEL control signals are all in their deasserted states (e.g., at low logic voltages). Accordingly, the positive terminal of PV Cell 360 connected to node B+ is coupled to node D+ by way of terminals 6 and 7 of relay 320. Node D+ is coupled to the measurement equipment 380; therefore, the positive terminal of PV cell 360 is coupled to the measurement equipment 380. Also, the negative terminal of PV cell 360 is coupled to node D-. The resistor R10 is coupled between nodes D+ and D- by way of terminals 6 and 7 of relay 310. Thus, the resistor R10 is coupled across the positive and negative terminals of the PV cell 360.

The positive terminals of PV cell 370 connected to node T+ (or via resistor R41) is coupled to node D- by way of terminals 2 and 3 of relay 320 and resistor R20. The negative terminals of PV cell 370 connected to node T- (or via resistor R42) is directly coupled to node D-. Accordingly, resistor R20 is coupled across the positive and negative terminals of PV cell 370.

Resistor R30 is coupled between node D- and ground; and thus, provides a discharge path for both PV cells 360 and 370. The positive terminal of PV cell 360 connected to node B+ is coupled to the positive input of the voltage sense circuit 350 by way of terminals 7 and 6 of relay 330. Similarly, the negative terminal of PV cell 360 connected to node D- is coupled to the negative input of the voltage sense circuit 350 by way of terminals 2 and 3 of relay 330.

Figure 3B:
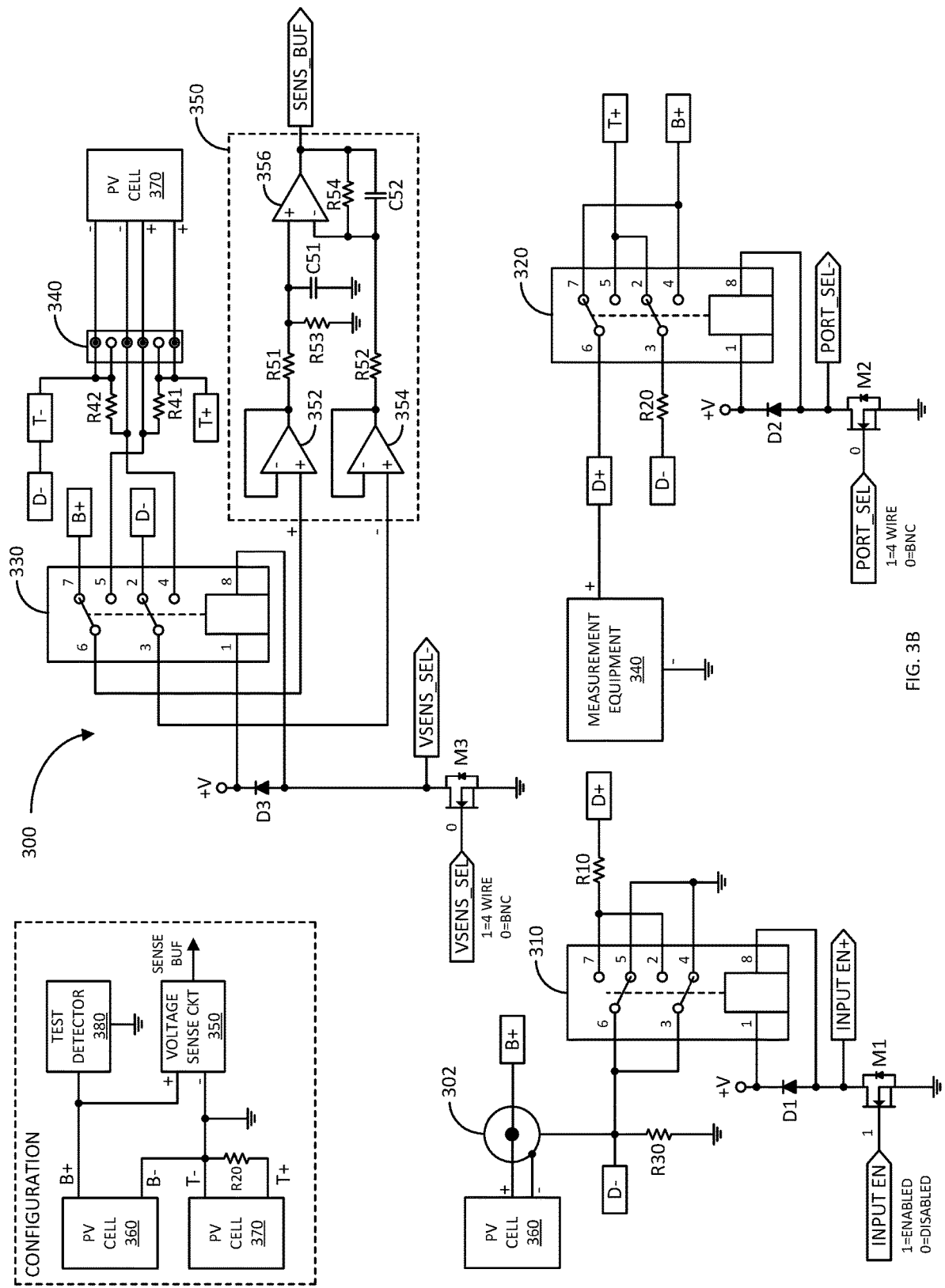
FIG. 3B illustrates a schematic diagram of the exemplary dual-channel measurement apparatus of FIG. 3A in a second configuration in accordance with another aspect of the disclosure.

FIG. 3B illustrates a schematic diagram of the exemplary dual-channel measurement apparatus 300 in an active selected BNC channel configuration in accordance with another aspect of the disclosure. A summary of this configuration is depicted on an upper left portion of FIG. 3B. That is, in the active selected BNC configuration, the positive terminal of the PV cell 360 is coupled to the positive inputs of the measurement equipment 380 and the voltage sense circuit 350. The negative terminals of the PV cells 360 and 370 are coupled to ground, which is also coupled to the negative input of the voltage sense circuit 350. The resistor R20 is coupled across the positive and negative terminals of the PV cell 370.

In this configuration, the PV cell 360 is fully coupled to the measurement equipment 380 and the voltage sense circuit 350 for measurement of one or more characteristics of the PV cell 360. Also, in this configuration, the resistor R20 coupled across the terminals of the PV cell 370 protects this cell from adverse consequence due to ambient light incident upon the cell 370.

To effectuate the active selected BNC configuration, the INPUT EN signal is in an asserted state (e.g., at a high logic voltage), and PORT_SEL and VSENS_SEL signals are at their deasserted states (e.g., at low logic voltages). Accordingly, the positive terminal of PV Cell 360 connected to node B+ is coupled to node D+ by way of terminals 7 and 6 of relay 320. Node D+ is coupled to the measurement equipment 380; therefore, the positive terminal of PV cell 360 is coupled to the measurement equipment 380. Also, the negative terminal of PV cell 360 is coupled to node D-, which is grounded via terminals 6 and 5 and 3 and 4 of relay 310. Since the negative terminal of the measurement equipment 380 is coupled to ground, the PV cell 360 is fully coupled to the measurement equipment 380.

The positive terminals of PV cell 370 connected to node T+ (or via resistor R41) is coupled to node D- by way of terminals 2 and 3 of relay 320 and resistor R20. The negative terminals of PV cell 370 connected to node T- (or via resistor R42) is directly coupled to node D-. Accordingly, resistor R20 is coupled across the positive and negative terminals of PV cell 370.

The positive terminal of PV cell 360 connected to node B+ is coupled to the positive input of the voltage sense circuit 350 by way of terminals 7 and 6 of relay 330. Similarly, the negative terminal of PV cell 360 connected to node D- is coupled to the negative input of the voltage sense circuit 350 by way of terminals 2 and 3 of relay 330.

Figure 3C:
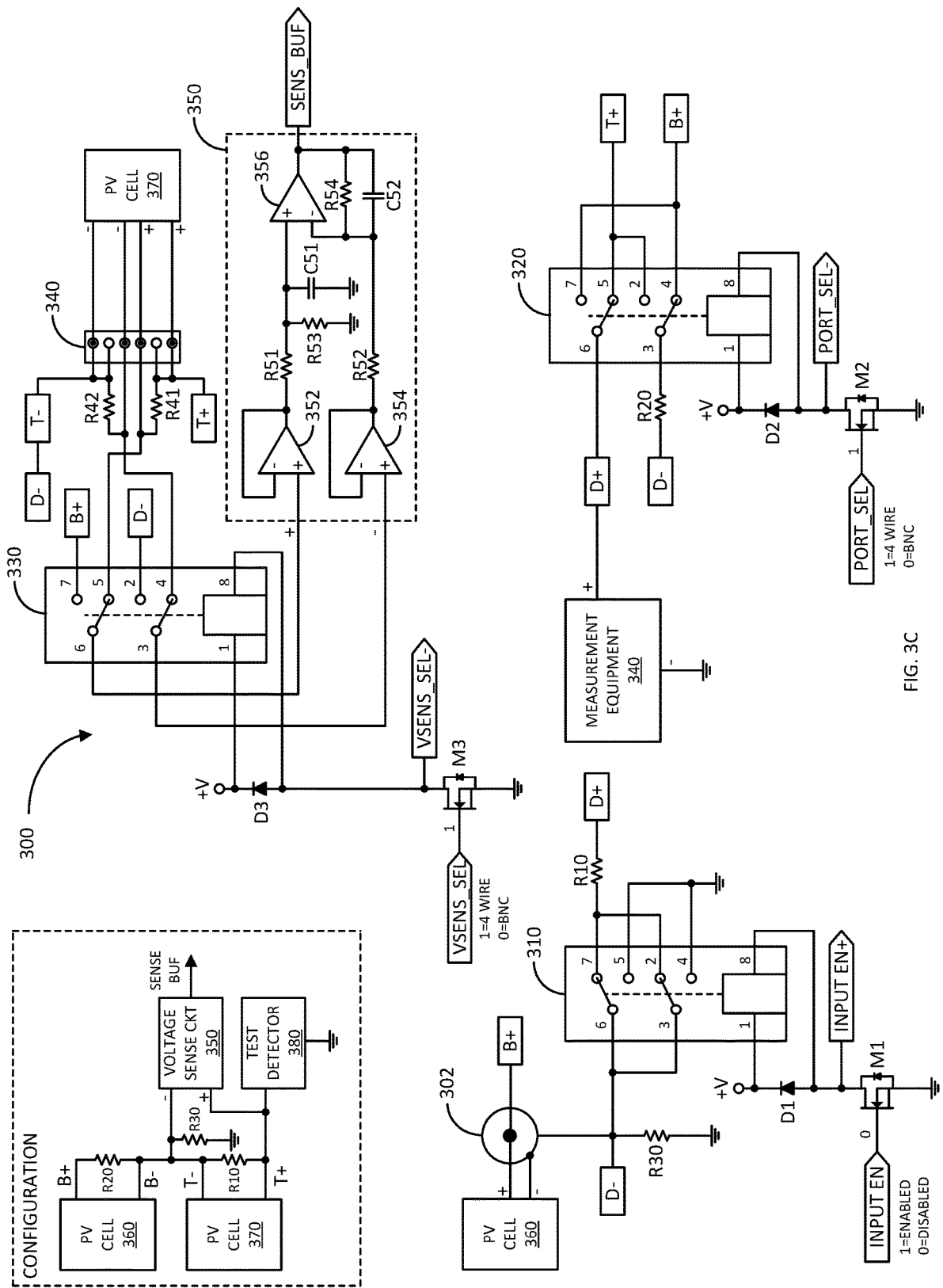
FIG. 3C illustrates a schematic diagram of the exemplary dual-channel measurement apparatus of FIG. 3A in a third configuration in accordance with another aspect of the disclosure.

FIG. 3C illustrates a schematic diagram of the exemplary dual-channel measurement apparatus 300 in an inactive selected 4-Wire channel configuration in accordance with another aspect of the disclosure. A summary of this configuration is depicted on an upper left portion of FIG. 3C. That is, in the inactive selected 4-Wire channel configuration, the positive terminal of the PV cell 370 is coupled to the positive inputs of the measurement equipment 380 and the voltage sense circuit 350. The negative terminals of the PV cells 360 and 370 are coupled to the negative input of the voltage sense circuit 350. The resistor R30 is coupled between the negative terminals of the PV cells 360 and 370 and ground. And, the resistor R20 is coupled across the positive and negative terminals of the PV cell 360. In this configuration, the resistors R10, R20, and R30 protect the PV cells 370 and 360 from adverse consequence due to ambient light incident upon the cells. Additionally, in this configuration, the positive terminal of the PV cell 370 is coupled to the measurement equipment 380.

To effectuate the inactive selected 4-Wire channel configuration, the INPUT EN signal is at a deasserted state (e.g., a low logic voltage), and the PORT_SEL and VSENS_SEL signals are at asserted states (e.g., at high logic voltages). Accordingly, the positive terminals of PV Cell 370 connected to node T+(or via resistor R41) is coupled to node D+ by way of terminals 5 and 6 of relay 320. Node D+ is coupled to the measurement equipment 380; therefore, the positive terminal of PV cell 370 is coupled to the measurement equipment 380. Also, the negative terminals of PV cell 370 is coupled to node D− (or via resistor R42). The resistor R10 is coupled between nodes D+ and D− by way of terminals 7 and 6 of relay 310. Thus, the resistor R10 is coupled across the positive and negative terminals of the PV cell 370.

The positive terminal of PV cell 360 connected to node B+ is coupled to node D− by way of terminals 4 and 3 of relay 320 and resistor R20. The negative terminal of PV cell 360 is connected directly to node D−. Accordingly, resistor R20 is coupled across the positive and negative terminals of PV cell 360.

Resistor R30 is coupled between node D− and ground; and thus, provides a discharge path for both PV cells 360 and 370. The positive terminals of PV cell 370 is coupled to the positive input of the voltage sense circuit 350 by way of terminals 5 and 6 of relay 330. Similarly, the negative terminals of PV cell 370 is coupled to the negative input of the voltage sense circuit 350 by way of terminals 4 and 3 of relay 330.

Figure 3D:
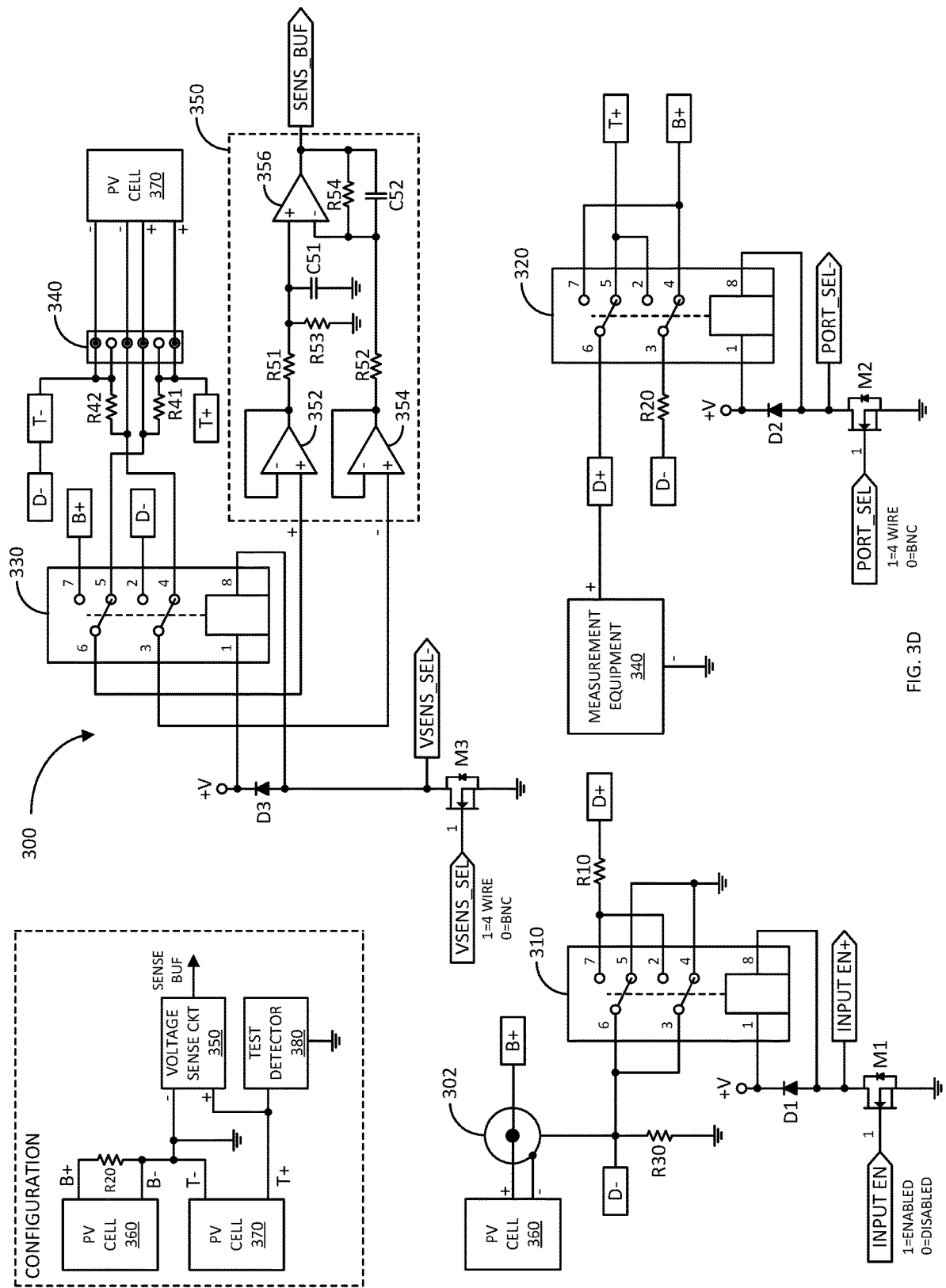
FIG. 3D illustrates a schematic diagram of the exemplary dual-channel measurement apparatus of FIG. 3A in a fourth configuration in accordance with another aspect of the disclosure.

FIG. 3D illustrates a schematic diagram of the exemplary dual-channel measurement apparatus 300 in an active selected 4-Wire channel configuration in accordance with another aspect of the disclosure. A summary of this configuration is depicted on an upper left portion of FIG. 3D. That is, in the active selected 4-Wire channel configuration, the positive terminal of the PV cell 370 is coupled to the positive inputs of the measurement equipment 380 and the voltage sense circuit 350. The negative terminals of the PV cells 360 and 370 are coupled to ground, which is also coupled to the negative input of the voltage sense circuit 350. The resistor R20 is coupled across the positive and negative terminals of the PV cell 360.

In this configuration, the PV cell 370 is fully coupled to the measurement equipment 380 and the voltage sense circuit 350 for measurement of one or more characteristics of the PV cell 370. Also, in this configuration, the resistor R20, coupled across the terminals of the PV cell 360, protects this cell from adverse consequence due to ambient light incident upon the cell 360.

To effectuate the active selected 4-Wire channel configuration, the INPUT EN, PORT_SEL and VSENS_SEL signals are all at asserted states (e.g., at high logic voltages). Accordingly, the positive terminals of PV Cell 370 connected to node T+ (or via resistor R41) is coupled to node D+ by way of terminals 5 and 6 of relay 320. Node D+ is coupled to the measurement equipment 380; therefore, the positive terminals of PV cell 370 is coupled to the measurement equipment 380. Also, the negative terminals of PV cell 370 is coupled to node D− (or via resistor R42), which is grounded via terminals 6 and 5 and 3 and 4 of relay 310. Since the negative terminal of the measurement equipment 380 is coupled to ground, the PV cell 370 is fully coupled to the measurement equipment 380.

The positive terminal of PV cell 360 connected to node B+ is coupled to node D− by way of terminals 4 and 3 of relay 320 and resistor R20. The negative terminal of PV cell 360 is directly coupled to node D−. Accordingly, resistor R20 is coupled across the positive and negative terminals of PV cell 360.

The positive terminals of PV cell 370 is coupled to the positive input of the voltage sense circuit 350 by way of terminals 5 and 6 of relay 330. Similarly, the negative terminals of PV cell 370 is coupled to the negative input of the voltage sense circuit 350 by way of terminals 4 and 3 of relay 330.

Figure 4:
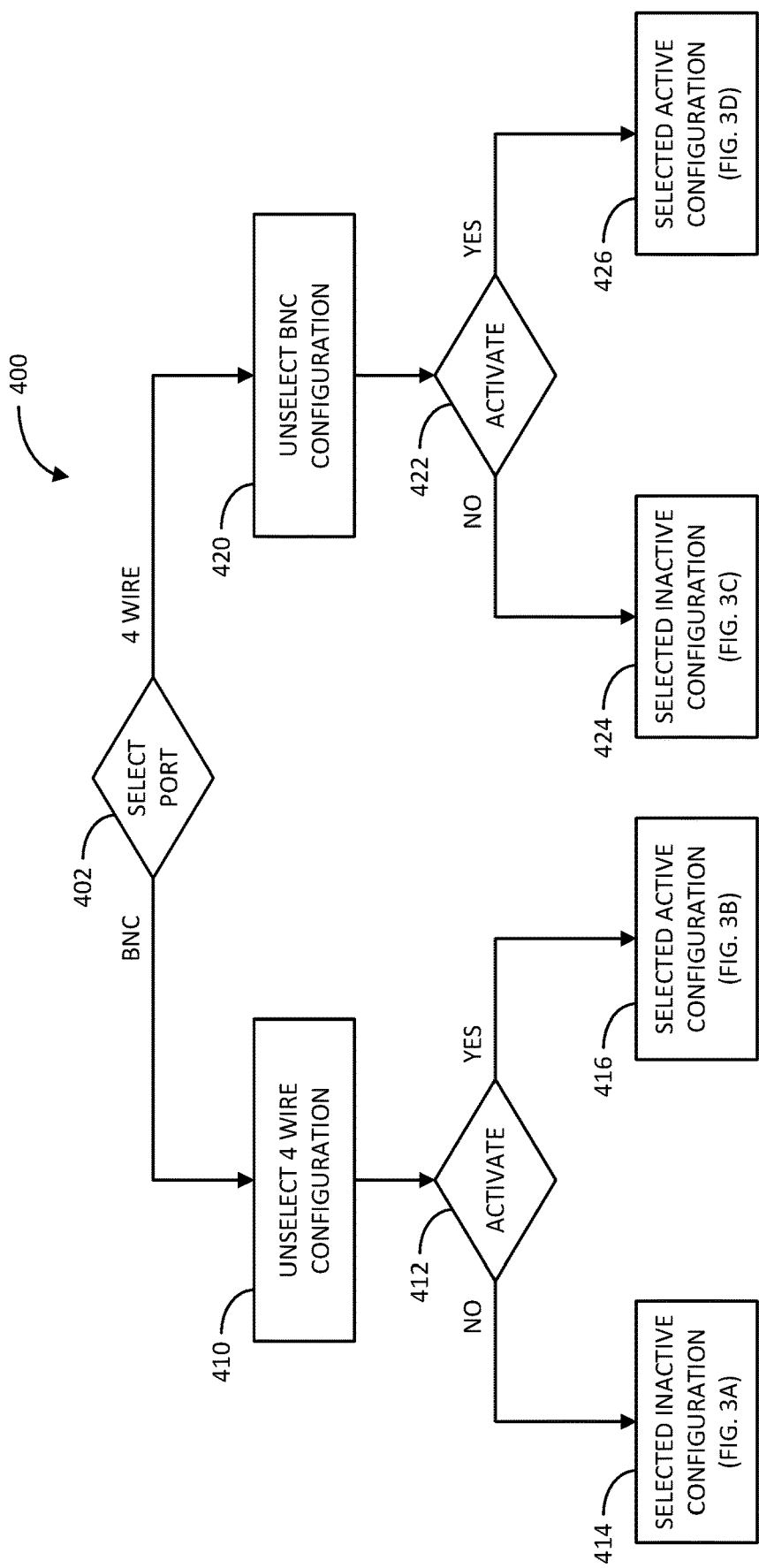
FIG. 4 illustrates a flow diagram of an exemplary method of operating a dual-channel measurement apparatus in accordance with another aspect of the disclosure.

FIG. 4 illustrates a flow diagram of an exemplary method 400 of operating the dual-channel measurement apparatus 300 in accordance with another aspect of the disclosure. According to the method 400, a selection is made of the port or channel (e.g., BNC or 4-Wire) connected to a PV cell for which a measurement of one or more characteristics is to be taken (block 402). If such PV cell is connected to the BNC port or channel, the measurement apparatus 300 unselects the 4-Wire port or channel by coupling resistor R20 across the positive and negative inputs of the 4-Wire port (block 410).

Then, according to the method 400, it is determined whether to activate the selected BNC port or channel (block 412). If it is determined not to activate the selected BNC port or channel, then the measurement apparatus 300 is configured in the inactive selected BNC configuration as depicted in FIG. 3A (block 414). If, on the other hand, it is determined to activate the selected BNC port or channel, then the measurement apparatus 300 is configured in the active selected BNC configuration as depicted in FIG. 3B (block 416).

If, in block 402, the 4-Wire port or channel is selected because it is desired to take a measurement of one or more characteristics of a PV cell connected to the 4-Wire port, the measurement apparatus 300 unselects the BNC port or channel by coupling resistor R20 across the positive and negative terminals of the BNC port (block 420).

Then, according to the method 400, it is determined whether to activate the selected 4-Wire port or channel (block 422). If it is determined not to activate the selected 4-Wire port or channel, then the measurement apparatus 300 is configured in the inactive selected 4-Wire configuration as depicted in FIG. 3C (block 424). If, on the other hand, it is determined to activate the selected 4-Wire port or channel, then the measurement apparatus 300 is configured in the active selected 4-Wire channel configuration as depicted in FIG. 3D (block 426).

Figure 5:
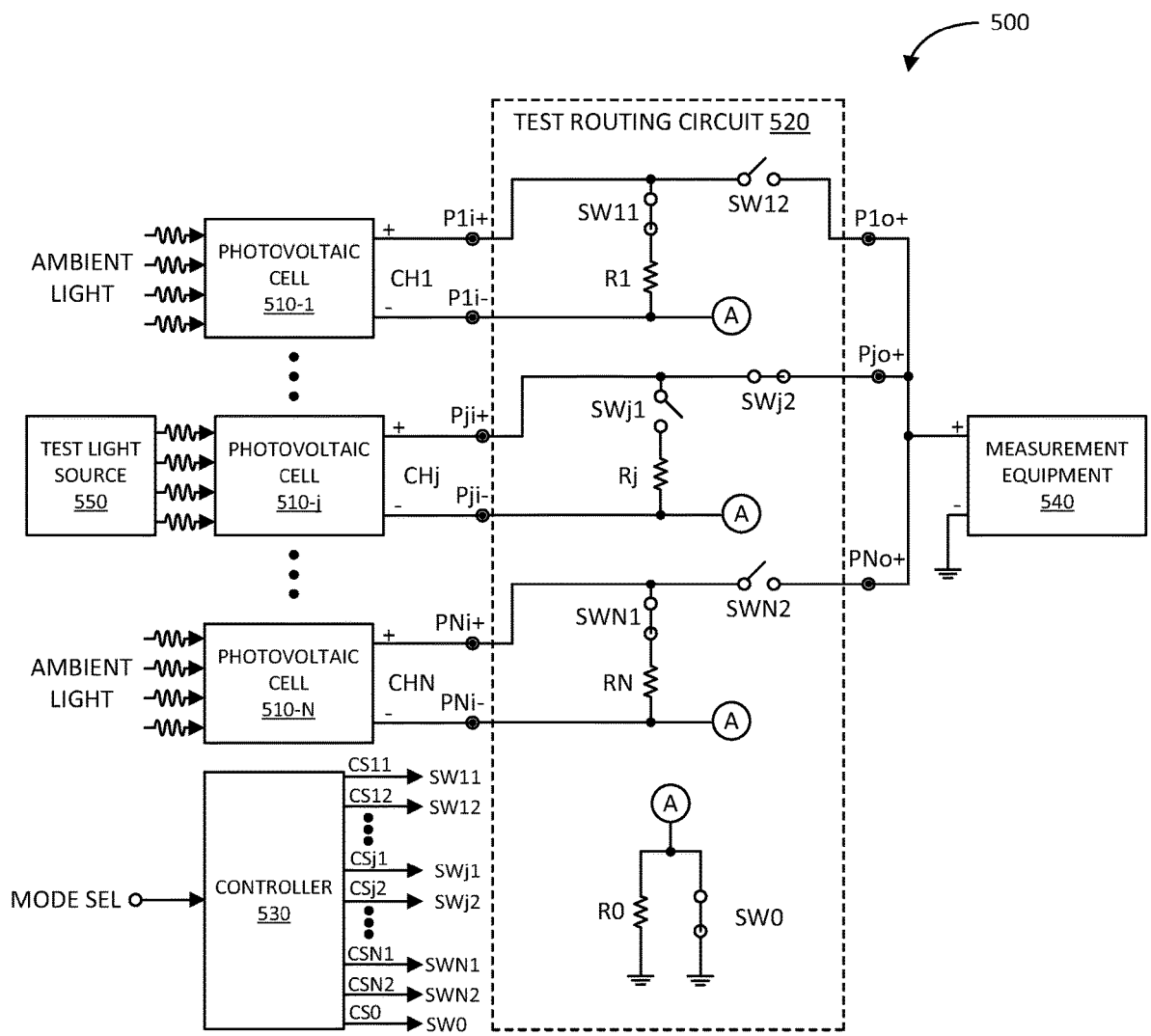
FIG. 5 illustrates a schematic diagram of an exemplary N-channel measurement apparatus in accordance with another aspect of the disclosure.

FIG. 5 illustrates a schematic diagram of an exemplary N-channel measurement apparatus 500 in accordance with another aspect of the disclosure. The N-channel measurement apparatus 500 may be a more general example of the measurement apparatuses 100, 200, and 300 previously discussed. For instance, the measurement apparatus 100 is a special case of measurement apparatus 500 where the integer N is one (1). The measurements apparatuses 200 and 300 are special cases of measurement apparatus 500 where the integer N is two (2). It shall be understood that the integer N may be any number.

In particular, the measurement apparatus 500 includes a test routing circuit 520 and a controller 530 for setting various configurations for the test routing circuit 520. As previously discussed, the measurement apparatus 500 includes N channel(s) for selectively coupling PV cell(s_ associated with the N channel(s) to a measurement equipment 540 for measurement purposes. Although, in this example, three (3) channels (e.g., channels 1, j, and N) are explicitly shown for illustration and explanation purposes, it shall be understood that N may be one (1) or two (2).

With regard to channel 1, the test routing circuit 520 includes positive and negative input ports P1i+ and P1i−, switches SW11 and SW12, resistor R1, and positive output port P1o+. The positive and negative input ports P1i+ and P1i− are coupled to the positive and negative terminals of PV cell 510-l, respectively. The switch SW11 and resistor R1 are coupled in series between the positive and negative input ports P1i+ and P1i−. The switch SW12 is coupled between the positive input port P1i+ and the positive output port P1o+, and situated on the output (right) side of the series-connected switch SW11 and resistor R1.

Similarly, with regard to channel j, the test routing circuit 520 includes positive and negative input ports Pji+ and Pji−, switches SWj1 and SWj2, resistor Rj, and positive output port Pjo+. The positive and negative input ports Pji+ and Pji− are coupled to the positive and negative terminals of PV cell 510-j, respectively. The switch SWj1 and resistor Rj are coupled in series between the positive and negative input ports Pji+ and Pji−. The switch SWj2 is coupled between the positive input port Pji+ and the positive output port Pjo+, and situated on the output (right) side of the series-connected switch SWj1 and resistor Rj.

In a like manner, with regard to channel N, the test routing circuit 520 includes positive and negative input ports PNi+ and PNi−, switches SWN1 and SWN2, resistor RN, and positive output port PNo+. The positive and negative input ports PNi+ and PNi− are coupled to the positive and negative terminals of PV cell 510-N, respectively. The switch SWN1 and resistor RN are coupled in series between the positive and negative input ports PNi+ and PNi−. The switch SWN2 is coupled between the positive input port PNi+ and the positive output port PNo+, and situated on the output (right) side of the series-connected switch SWN1 and resistor RN.

The test routing circuit 520 further includes an activation circuit comprising resistor R0 and switch SW0 coupled in parallel between node A and ground. Node A is coupled to the negative input ports P1i− to PNi− associated with all the N channels. Based on a mode selection ("MODE SEL") signal, the controller 530 generates control signals CS11/CS12 to CSj1/CSj2 to CSN1/CSN2 and CS0 for controlling the open/close states of switches SW11/SW12 to SWj1/SWj2 to SWN1/SWN2 and SW0, respectively.

In operation, based on the MODE SEL signal indicating a selection of a channel, such as channel j, the controller 530 generates control signals CSj1 and CSj2 to set switches SWj1 and SWj2 in open and close states, respectively. Additionally, the controller 530 unselects the remaining channels by generating the corresponding control signals CS*1 and CS*2 to close and open corresponding switches SW*1 and SW*2 (where * denotes the channel number except the selected jth channel). Based on the MODE SEL signal indicating an activation or inactivation of the selected channel, the controller 530 generates control signal CS0 to close or open switch SW0, respectively.

Accordingly, the test routing circuit 500 maintains a first resistor across the terminals of each of the connected PV cells and a second resistor between the negative terminals and ground when all channels are inactivated. This protects the PV cells from adverse consequences due to ambient light being incident upon the cells. The selected cell, although inactive, is partially coupled to the measurement equipment 540. That is, only the positive terminal of the selected PV cell is coupled to the positive input of the measurement equipment 540. The negative terminal of the selected PV cell is coupled to the negative input of the measurement equipment 540, which is at ground potential, by way of the second resistor.

When the selected channel is activated, the test routing circuit 520 fully couples the selected PV cell to the measurement equipment 540 for measurement purposes. That is, the positive and negative terminals of the selected PV cell are coupled to the positive and negative inputs of the measurement equipment 540. For the unselected PV cells, the test routing circuit 520 maintains a resistor across their respective terminals, and also grounds their respective negative terminals. Thus, while measurements of the selected PV cell are being taken, the unselected PV cells are protected from adverse consequences due to ambient light incident upon the unselected cells.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a routing circuit configured to:
      couple a first resistor across positive and negative inputs of a first input port in accordance with a first configuration, wherein the positive and negative inputs of the first input port is configured to be coupled to positive and negative terminals of a photovoltaic cell;
      couple a second resistor between the negative input of the first input port to ground in accordance with the first configuration, wherein the first and second resistors are coupled in series between the positive input of the first input port and ground;
      decouple the first resistor from the first input port in accordance with a second configuration; and
      couple the first input port to an output port in accordance with the second configuration, wherein the output port is configured to be coupled to a measurement equipment; and
   a controller configured to generate at least one control signal to selectively configure the routing circuit in the first or second configuration based on a mode select signal.

2. The apparatus of claim 1, wherein the routing circuit further comprises:
   a first switch coupled in series with the first resistor between the positive and negative inputs of the first input port;
   a second switch coupled in parallel with the second resistor between the negative input of the first input port and ground; and
   a third switch coupled between the positive input of the first input port and the output port.

3. The apparatus of claim 2, wherein the controller is configured to:
   generate the at least one control signal to close the first switch and open the second and third switches in accordance with the first configuration; and
   generate the at least one control signal to open the first switch and close the second and third switches in accordance with the second configuration.

4. The apparatus of claim 3, wherein the controller is configured to generate the at least one control signal to close the first and third switches and open the second switch in accordance with a third configuration.

19

5. An apparatus, comprising:
a routing circuit configured to:
couple first and second resistors across positive and negative inputs of first and second input ports, respectively, in accordance with a first configuration, wherein the positive and negative inputs of the first and second input ports are configured to be coupled to terminals of first and second photovoltaic cells, respectively;
couple a third resistor coupled between respective negative inputs of the first and second input ports and ground in accordance with the first configuration, wherein the first and third resistors are coupled in series between the positive input of the first input port and ground;
decouple the first resistor from being coupled across the positive and negative inputs of the first input port in accordance with a second configuration; and
couple the first input port to an output port in accordance with the second configuration, wherein the output port is configured to be coupled to a measurement equipment; and
a controller configured to generate at least one control signal to selectively configure the routing circuit in the first or second configuration based on a mode select signal.

6. The apparatus of claim 5, wherein the routing circuit is configured to:
couple the second resistor across the positive and negative inputs of the second input port in accordance with the second configuration; and
couple the positive input of the first input port to the output port in accordance with the second configuration.

7. The apparatus of claim 6, wherein the routing circuit is configured to:
couple the third resistor between the respective negative inputs of the first and second ports and ground in accordance with the first configuration; and
decouple the third resistor from being coupled between the respective negative inputs of the first and second ports and ground in accordance with the second configuration.

8. The apparatus of claim 7, wherein the routing circuit further comprises:
a first switch coupled in series with the first resistor between the positive and negative inputs of the first input port;
a second switch coupled between the positive input of the first input port and the output port;
a third switch coupled in series with the second resistor between the positive and negative inputs of the second input port;
a fourth switch coupled between the positive input of the second input port and the output port; and
a fifth switch coupled in parallel with the third resistor between the negative inputs of the first and second input ports and ground.

9. The apparatus of claim 8, wherein the controller is configured to:
generate the at least one control signal to close the first, second, and third switches and open the fourth and fifth switches in accordance with the first configuration; and
generate the at least one control signal to open the first and fourth switches and close the second, third, and fifth switches in accordance with the second configuration.

20

10. The apparatus of claim 9, wherein the controller is configured to generate the at least one control signal to close the first, third, and fourth switches and open the second and fifth switches in accordance with a third configuration.

11. The apparatus of claim 10, wherein the controller is configured to generate the at least one control signal to close the first, fourth, and fifth switches and open the second and fourth switches in accordance with a fourth configuration.

12. An apparatus, comprising:
a first input port including positive and negative inputs configured to be coupled to positive and negative terminals of a first photovoltaic cell;
a second input port including positive and negative inputs configured to be coupled to positive and negative terminals of a second photovoltaic cell;
an output port configured to be coupled to a measurement equipment; and
a routing circuit configured:
in a first configuration where first and second resistors are coupled across the respective positive and negative inputs of the first and second input ports, a third resistor is coupled between the negative inputs of the first and second input ports and ground, and the positive input port of the first input port is coupled to the output port;
in a second configuration where the second resistor is coupled across the positive and negative inputs of the second input port, the first resistor is not coupled across the positive and negative inputs of the first input port, the third resistor is shorted across the negative inputs of the first and second input ports and ground, and the positive input port of the first input port is coupled to the output port;
in a third configuration where first and second resistors are coupled across the respective positive and negative inputs of the second and first input ports, the third resistor is coupled between the negative inputs of the first and second input ports and ground, and the positive input port of the second input port is coupled to the output port; and
in a fourth configuration where the second resistor is coupled across the positive and negative inputs of the first input port, the first resistor is not coupled across the positive and negative inputs of the second input port, the third resistor is shorted across the negative inputs of the first and second input ports and ground, and the positive input port of the second input port is coupled to the output port.

13. The apparatus of claim 12, wherein the routing circuit comprises:
a first relay including first and second single-throw-double-pole (STDP) switches; and
a second relay including third and fourth STDP switches;
wherein throw terminals of the first and second STDP switches are coupled to the negative inputs of the first and second input ports, wherein the third resistor is coupled between the throw terminals of the first and second STDP switches and ground, wherein the second resistor is coupled between the throw terminals of the first and second STDP switches and a throw terminal of the third STDP switch, wherein a first set of in-phase pole terminals of the first and second STDP switches are coupled to ground, wherein the first resistor is coupled between a second set of in-phase pole terminals of the first and second STDP and a throw terminal of the fourth STDP switches, wherein a first set of out-of-phase pole terminals of the third and fourth STDP switches are coupled to the positive input of the first input port, wherein a second set of out-of-phase pole terminals of the third and fourth STDP switches are coupled to the positive input of the second input port, and wherein the throw terminal of the fourth STDP switch is coupled to the measurement equipment.

14. The apparatus of claim 12, further comprising a voltage sense circuit configured to generate a sense voltage based on a voltage generated by a selected one of the first and second photovoltaic cells.

15. The apparatus of claim 14, further comprising a relay including first and second single-throw-double-pole (STDP) switches, wherein throw terminals of the first and second STDP switches are coupled to respective inputs of the voltage sense circuit, wherein a first set of in-phase pole terminals are coupled to the positive inputs of the first and second input ports, and wherein a second set of in-phase pole terminals are coupled to the negative inputs of the first and second input ports.

* * * * *